United States Patent
Jennings et al.

(10) Patent No.: US 11,368,156 B2
(45) Date of Patent: Jun. 21, 2022

(54) METHOD AND APPARATUS FOR PROVIDING FIELD-PROGRAMMABLE GATE ARRAY (FPGA) INTEGRATED CIRCUIT (IC) PACKAGE

(71) Applicant: GOWIN Semiconductor Corporation, Ltd., GuangZhou (CN)

(72) Inventors: Grant Thomas Jennings, Austin, TX (US); Jinghui Zhu, San Jose, CA (US)

(73) Assignee: GOWIN Semiconductor Corporation, Ltd., GuangZhou (CN)

( * ) Notice: Subject to any disclaimer, the term of this patent is extended or adjusted under 35 U.S.C. 154(b) by 0 days.

(21) Appl. No.: 17/334,985

(22) Filed: May 31, 2021

(65) Prior Publication Data
US 2021/0376833 A1  Dec. 2, 2021

Related U.S. Application Data

(60) Provisional application No. 63/033,129, filed on Jun. 1, 2020.

(51) Int. Cl.
*H03K 19/17736* (2020.01)
*H03K 19/17728* (2020.01)

(52) U.S. Cl.
CPC ... *H03K 19/1774* (2013.01); *H03K 19/17728* (2013.01)

(58) Field of Classification Search
None
See application file for complete search history.

(56) References Cited

U.S. PATENT DOCUMENTS

| | | | | |
|---|---|---|---|---|
| 10,116,311 B2* | 10/2018 | Martin | ................... | G06F 30/34 |
| 2008/0052429 A1* | 2/2008 | Botchek | ............... | G06F 9/3879 |
| | | | | 712/E9.067 |
| 2018/0343010 A1* | 11/2018 | Kozaczuk | ........ | H03K 19/17728 |

* cited by examiner

*Primary Examiner* — Jany Richardson
(74) *Attorney, Agent, or Firm* — JW Law Group; James M. Wu

(57) ABSTRACT

An integrated circuit ("IC") module includes a substrate, multiple field-programmable gate array ("FPGA") dies, and pads capable of being selectively configured to perform one or more user defined logic functions. The substrate is configured to house multiple FPGA dies side-by-side in an array formation facilitating transmission of signals between the FPGA dies or chips. The FPGA dies are placed on the substrate functioning as a single FPGA device. The periphery dies of the FPGA dies are configured for external connectivity and the interior dies which are interconnected to perform user defined logic functions. The pads, in one aspect, coupling to the FPGA dies, are configured to provide connections between at least some of the FPGA dies.

20 Claims, 14 Drawing Sheets

METHOD AND APPARATUS FOR PROVIDING FIELD-PROGRAMMABLE GATE ARRAY (FPGA) INTEGRATED CIRCUIT (IC) PACKAGE

PRIORITY

This application claims the benefit of priority based upon U.S. Provisional Patent Application Ser. No. 63/033,129 filed on Jun. 1, 2020 in the name of the same inventors and entitled "Method and System for High Density FPGAs through Multi-FPGA Partitioning and Multiple FPGA Dies in the Same Package," the disclosure of which is hereby incorporated into the present application by reference.

FIELD

The exemplary embodiment(s) of the present invention relates to the field of computer hardware and software. More specifically, the exemplary embodiment(s) of the present invention relates to a module or package containing one or more programmable semiconductor devices such as a field-programmable gate arrays ("FPGAs") or programmable logic devices ("PLDs").

BACKGROUND

With increasing popularity of digital communication, artificial intelligence (AI), IoT (Internet of Things), and/or robotic controls, the demand for faster and efficient hardware and semiconductors with low power consumption is constantly in demand. To meet such demand, high-speed, flexible design, and low-power semiconductor chips are generally more desirable. Hardware industry typically has a variety of approaches to implement to achieve desirable logical functions.

A conventional approach uses dedicated custom integrated circuits and/or application-specific integrated circuits ("ASICs") to implement desirable functions. A shortcoming with ASIC approach is that this approach is generally expensive and limited flexibility. An alternative approach, which enjoys growing popularity, is utilizing programmable semiconductor devices ("PSD") such as programmable logic devices ("PLDs") or field programmable gate arrays ("FPGAs"). For instance, an end user can program a PSD to perform desirable functions.

A conventional PSD such as PLD or FPGA is a semiconductor chip that includes an array of programmable logic array blocks ("LABs") or logic blocks ("LBs"), routing resources, and input/output ("I/O") pins. Each LAB may further include multiple programmable logic elements ("LEs"). For example, each LAB can include 16 LEs to 128 LEs, wherein each LE can be specifically programmed to perform a function or a set of functions.

With fast changing technologies and rapid market access, the PSD becomes a more viable approach to meet consumer's demand. However, a challenge associated with developing and/or manufacturing FPGA dies with larger densities is complexity of long routes and added redrivers/flip-flops in the routing paths which could negatively impact overall FPGA performance.

SUMMARY

An integrated circuit ("IC") module includes a substrate, multiple field-programmable gate array ("FPGA") dies, and pads capable of being selectively configured to perform one or more user defined logic functions. The substrate is configured to house multiple IC chips side-by-side in a two-dimensional array formation for facilitating transmission of signals between the IC chips as well as to external devices such as remote host and/or servers. The FPGA dies are placed on the substrate functioning as a single FPGA device or entity. The periphery dies of the FPGA dies are configured for external connectivity and the interior dies which are interconnected to perform user defined logic functions. The pads, in one aspect, are coupled to the FPGA dies and configured to provide connection between at least some of the FPGA dies. To enhance inter-die communication, a serializer of FPGA die is coupled to a deserializer of a neighboring FPGA die for facilitating communication between the two FPGA dies.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
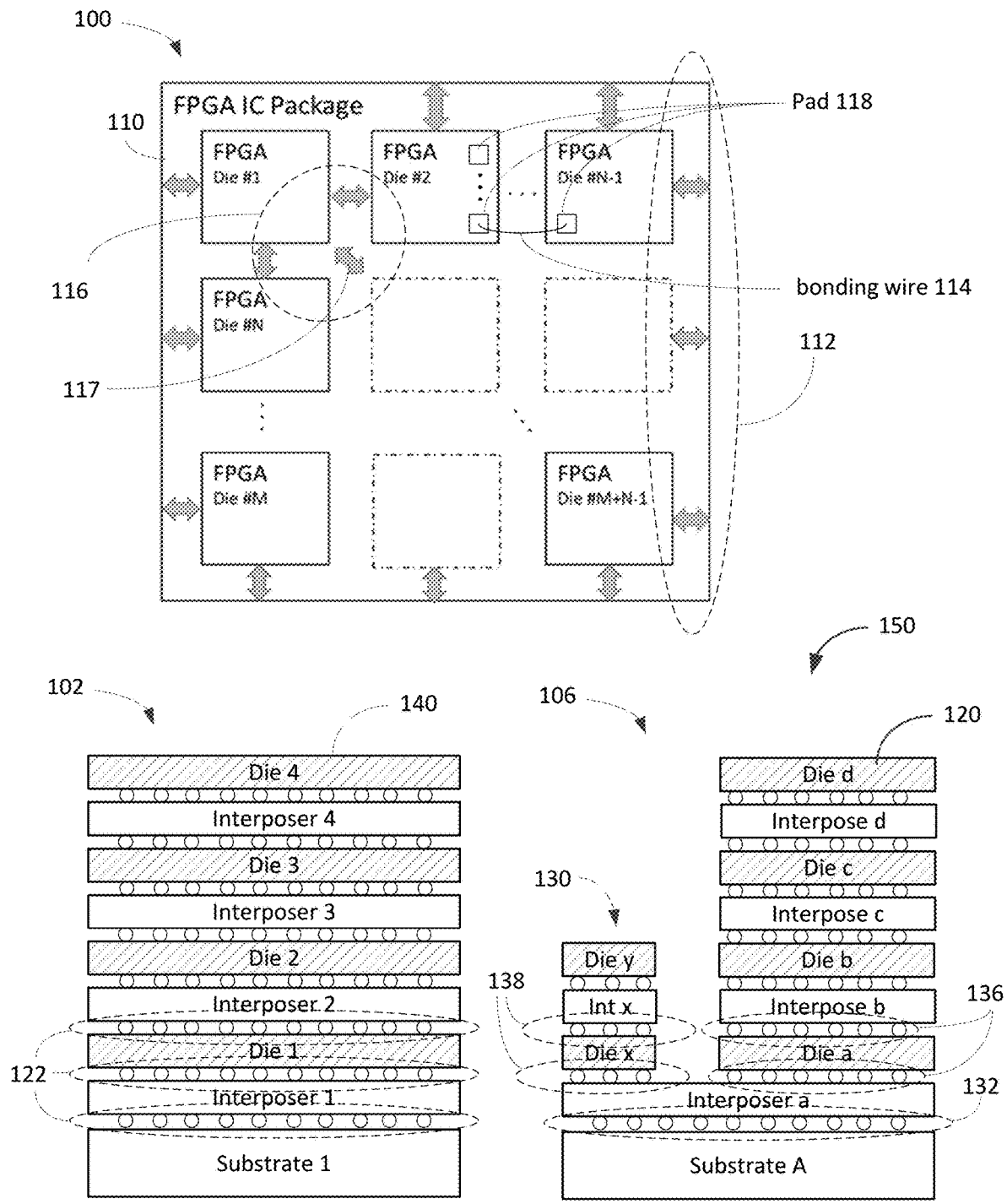
FIG. 1 is a block diagram illustrating a semiconductor module or package containing multiple FPGA or PLD dies in accordance with one embodiment of the present invention.

Embodiments of the present invention disclose a method(s) and/or apparatus for providing a programmable integrated circuit ("IC") module or package containing multiple PSD dies, PIC dies, and/or FGPA dies to behave as a single FPGA device.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of the present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field-programmable gate arrays (FPGAs), application-specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device, such as but not limited to, magnetoresistive random access memory ("MRAM"), phase-change memory, or ferroelectric RAM ("FeRAM"), flash memory, ROM (Read Only Memory), PROM (Programmable Read-Only Memory), EEPROM (Electrically Erasable Programmable Read-Only Memory), Jump Drive, magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

Embodiments of the present application disclose an IC package or module containing multiple programmable IC dies configured to function as a single FPGA device. The FPGA IC module or package includes a substrate, FPGA dies, and pads capable of being selectively configured to perform one or more user defined logic functions. The substrate is configured to house multiple IC chips side-by-side 2-dimential array formation for facilitating transmission of signals between the IC chips as well as external remote devices. The FPGA dies are placed on the substrate functioning as a single FPGA device. The periphery dies of the FPGA dies are configured for external connectivity and the interior dies which are interconnected to perform user defined logic functions. The pads, in one aspect, are on the FPGA dies and configured to provide direct connections between at least some of the FPGA dies. To provide inter-die communication or linkage, a serializer of FPGA die may be coupled to a deserializer of a neighboring FPGA die for facilitating communication between two FPGA dies.

Package with Multiple FPGA Dies

FIG. 1 illustrates block diagrams 100-106 showing semiconductor modules or packages containing multiple FPGA or PLD dies in accordance with one embodiment of the present invention. Diagram 100 illustrates an FPGA IC package 110 containing a side-by-side 2-dimential array formation containing multiple FPGA dies. Diagram 102 illustrates an FPGA IC package 140 containing multiple FPGA dies stacked vertically. Diagram 106 illustrates an FPGA IC package 150 which contains multiple independent stacks wherein each stack containing multiple FPGA dies. It should be noted that the underlying concept of the exemplary embodiment(s) of the present invention would not change if one or more blocks (circuit or elements) were added to or removed from FIG. 1.

Package 110 includes multiple programmable semiconductor dies organized in an array formation placed side-by-side for operating as a single programmable device or entity. The programmable semiconductor dies include, but not limited to, PSD dies, PIC dies, FPGA dies, PLD dies, or a combination of PSD dies, PIC dies, FPGA dies, PLD dies. To simplify forgoing discussion, the term "FPGA" is used in reference to the terms "PSD", "PIC", "FPGA", and/or "PLD". Package 110, also known as an FPGA IC module or package, illustrates a two-dimensional array containing multiple rows and columns of FPGA dies. For example, Package 110 includes M number of rows and N−1 number of columns (M×N−1) of FPGA dies, where M and N is an integer. In one embodiment, the periphery dies are FPGA dies situated in the perimeter of package 110. For example, the FPGA dies situated in row 1, row M, column 1, and/or column N−1 are considered as the periphery dies. The periphery dies can be configured or programmed to perform external input output ("IO") functions. For instance, the periphery dies are programmed to facilitate data communication between package 110 and one or more external devices as indicated by numeral 112. Noted that the external device can be a device situated outside of package 110.

The interior dies are also FPGA dies physically situated inside of the periphery dies. In one example, the interior dies can be programmed to perform user defined logic functions based on the bitstream of configuration data. Each interior die, in one aspect, can have eight neighboring dies wherein four neighboring dies are connected by diagonal links, connections, and/or channels as indicated by numeral 117.

Depending on the applications, the inter-die connections as indicated by numeral 117 can be established by IO ports of FPGA dies, serializer/deserializer IO transceivers of the FPGA dies, and/or pads 118 with bonding wires as indicated by numeral 114. It should be noted that the FPGA dies can be the same FPGA dies or a combination of FPGA dies with different sizes.

During operation, a large density or capacity FPGA device is created by placing multiple small density FPGA dies in a single IC package such as package 110. The small capacity FPGA dies are interconnected through their pads with bond wires as well as IO pins or connection of the dies. To design a large FPGA device, an FPGA partitioning software can be used to place, combine, and/or partition multiple-FPGA dies through configuration code manually or automatically. To place multiple FPGA dies within a package, the FPGA partitioning software, for instance, is used to repurpose, partition, repartition, and/or route FPGA designs across multiple FPGA dies to enhance or enlarge the capability of logic functions.

Package 110 includes multiple FPGA dies that can be placed within the package or module either by stacking dies or chips vertically or by placing dies or chips side-by-side. The periphery of package 110 can be used to provide connectivity to package IO pins as illustrated by numeral 112. The IOs of the interior dies can be used for interconnect between the FPGA dies as indicated by numeral 116-117. To overcome limited number of IO pins for inter-die communications, various pads using bonding wires for direct wiring are used to enhance inter-die connectivity. It should be noted that pad-to-pad connection for inter-die communication can have better performance than pin-to-pin connection partially because the capacitance of pad-to-pad is less than capacitance of pin-to-pin connection. In one embodiment, high-speed data paths for inter-die communication can be created by using source synchronous and/or CDR based serializers and deserializers, which already exist in the FPGA dies.

Package 140 illustrates a module containing four FPGA dies stacking vertically on substrate 1. In one embodiment, four interposers, namely interposer 1, 2, 3, 4 are used for coupling to dies 1, 2, 3, 4, respectively. An interposer such as interposer 1 is functioning as an interface between die to die or die to substrate providing additional signal routing between the pins of dies and sockets of substrate. Layers of solder balls or solder bumps 122 are used to provide contacts for stacked dies, ICs, and/or chips. It should be noted that pads and bonding wires can also be used between the dies to enhance connectivity.

Package 150 illustrates a substrate A containing multiple independent stacks 120-130. Stack 120 includes four FPGA dies a, b, c, d stacked vertically using multiple interposes a, b, c, d respectively. Bumps 132-136 are used to provide connections. Stack 130 includes two FPGA dies x, y stacked vertically using multiple interposes a, x with bumps 138. It should be noted that the underlying concept of the exemplary embodiment(s) of package would not change if one or more layers and/or stacks were added to or removed from diagram 102-106.

An advantage of employing an FPGA IC package is that it creates FPGAs with larger densities using multiple small density FPGA dies functioning as large FPGA devices.

Figure 2:
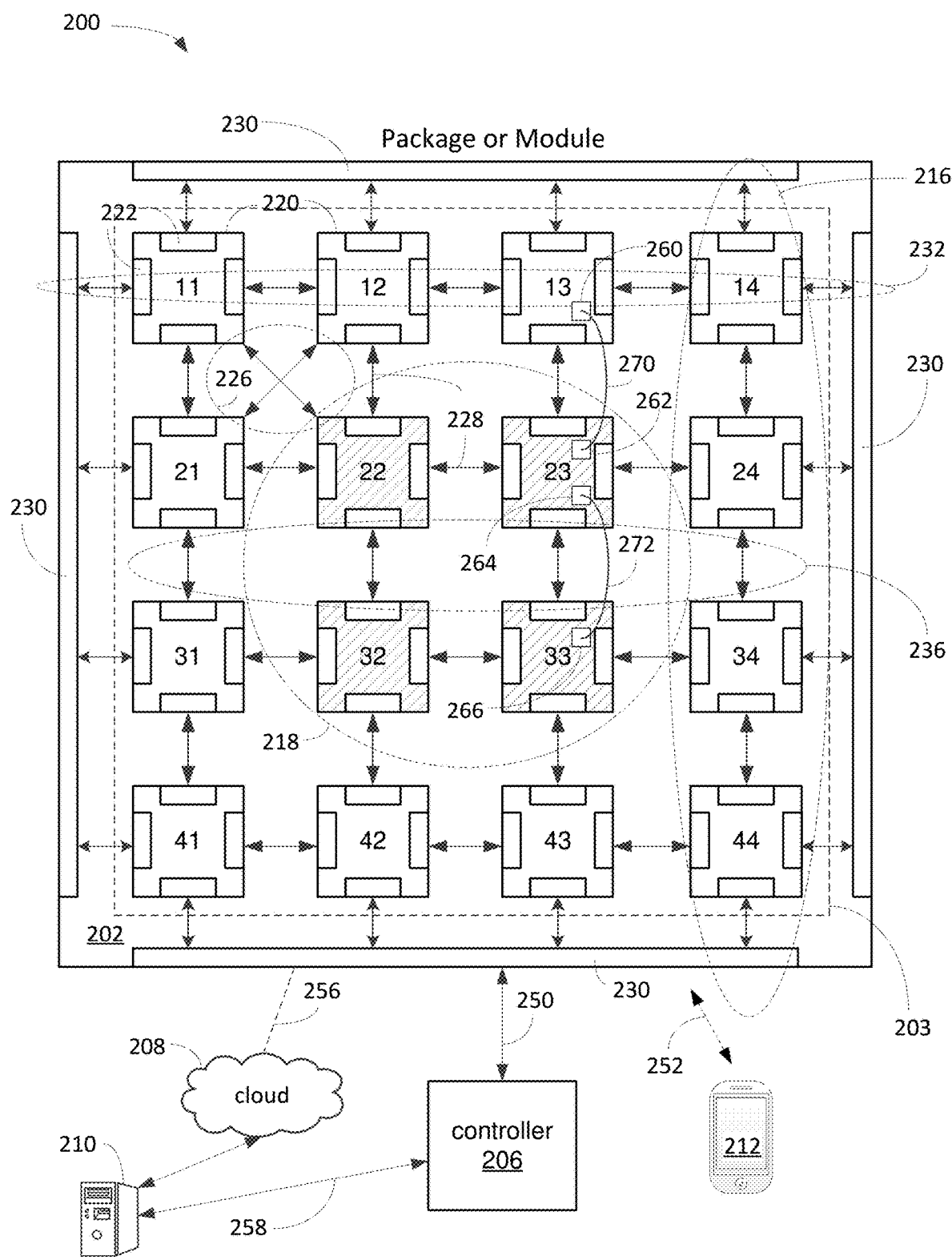
FIG. 2 is a block diagram illustrating an exemplary IC package or module containing sixteen (16) dies in accordance with one embodiment of the present invention.

FIG. 2 is a block diagram 200 illustrating an exemplary IC package or module 202 containing sixteen (16) dies in accordance with one embodiment of the present invention. Module 202 includes 16 FPGA dies organized in a 2-dimentional ("2D") array formation wherein dies 11, 12, 13, 14, 21, 24, 31, 34, 41, 42, 43, and 44 are the periphery dies while dies 22, 23, 32, 33 are the interior dies as indicated by numeral 218. The periphery dies such as indicated by numeral 216 are used to communicate with external devices, systems, and/or hosts via package IO block 230. It should be noted that the underlying concept of the exemplary embodiment(s) of the present invention would not change if one or more blocks (circuit or elements) were added to or removed from diagram 200.

In one embodiment, an IC module or package 202 includes a substrate 203, FPGA dies 11-44, pads 260-266. Substrate 203 is able to house multiple IC chips 11-44 side-by-side in an array formation for facilitating transmission of signals between the IC chips as well as to external devices via its IO blocks 230. FPGA dies 11-44, in one aspect, are placed on substrate 203 functioning as a single FPGA device. While the periphery dies are configured for external connectivity via IO blocks 230, the interior dies are interconnected to perform user defined logic functions. The pads such as pads 260-266 are coupled to FPGA dies 11-44 and provide connection between at least some of FPGA dies 11-44 via bonding wires 270-272. For example, pad 264 at FPGA die 23 is connected to pad 266 at FPGA die 33 via a bonding wire 272. Also, FPGA die 23 can receive data from FPGA die 33 via a clock and data recovery ("CDR") based serializers and deserializers ("serdes") transceiver(s). It should be noted that a serializer of FPGA die 33 is coupled to a deserializer of FPGA die 23 for facilitating inter-die communication between FPGA dies 23 and 33.

Package 202, in one aspect, includes a clock tree, not shown in FIG. 2, configured to distribute global clock signals to all or at least a portion of global clock pads of FPGA dies 11-44 for providing synchronized clock signals. Also, an IO voltage rail, not shown in FIG. 2, is used for coupling to all or at least a portion of power IO pins of FPGA dies 11-44 for facilitating power or voltage consistency of FPGA dies. It should be noted that package or module 202 can be fabricated as an IC as a system on a chip ("SOC"). Alternatively, module 202 can manufactured as a system in package ("SIP") containing multiple FPGA dies.

Package 202, in one example, is further coupled to a computer cloud 208, controller 206, and smart phone 212 via connections 250-256. In one aspect, package 202 can access to a server 210 via cloud 208 or via controller 206. Controller 206, in one embodiment, is a host providing configuration bitstream to program at least a portion of FPGA dies in package 202. Alternatively, package 202 can also receive configuration bitstream or data from smartphone 212 via a wireless network 252.

Figure 3:
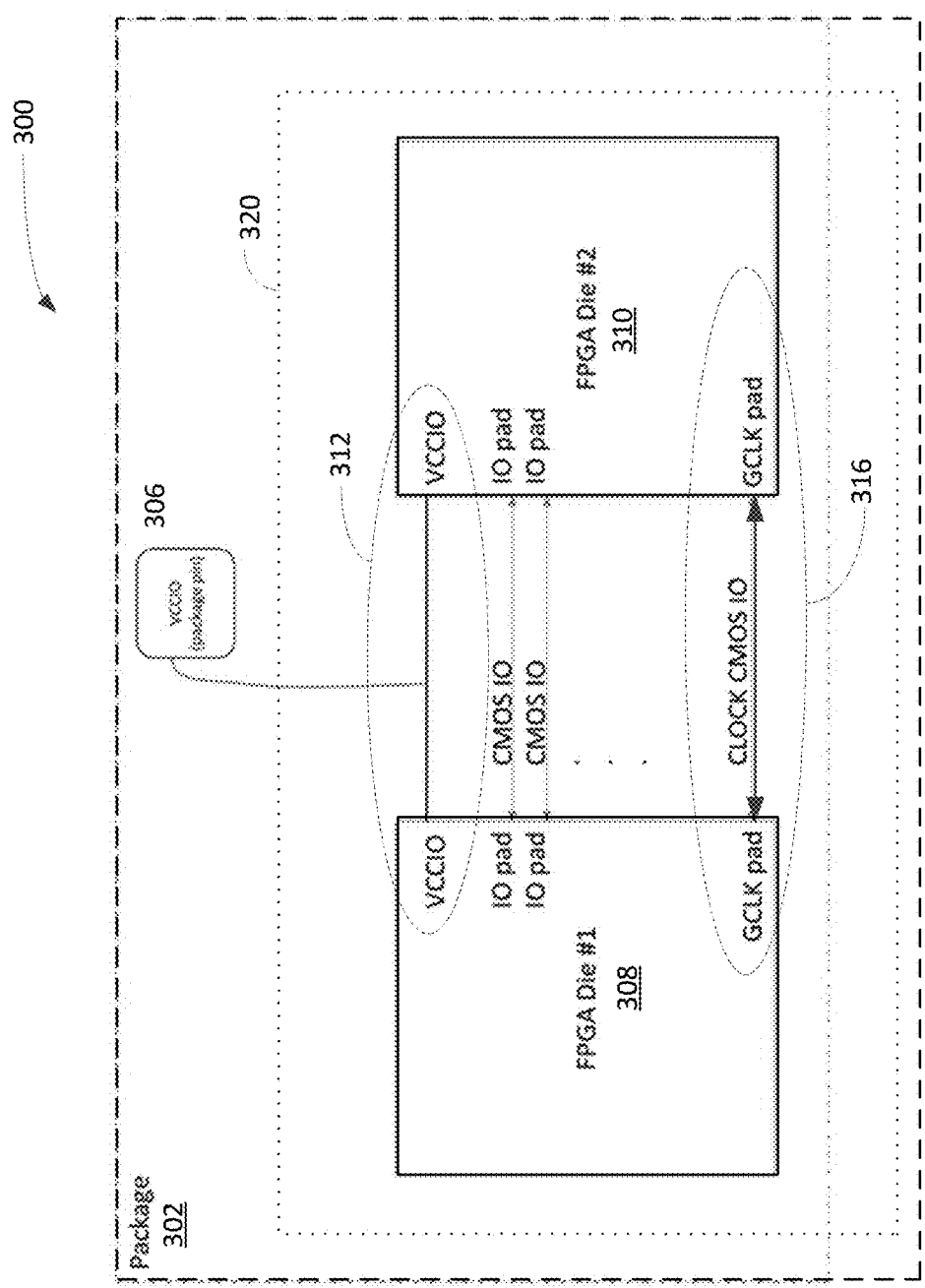
FIG. 3 is a block diagram illustrating power and/or clock application to an FPGA IC package in accordance with one embodiment of the present invention.

FIG. 3 is a block diagram 300 illustrating global clock signals and/or power supply to an FPGA IC package 302 in accordance with one embodiment of the present invention. Package 302, in one embodiment, includes a first FPGA die 308, second FPGA die 310, and VCCIO pin 306. Each FPGA die, such as FPGA die 308 or 310, includes a VCCIO pad and global clock ("GCLK") pad. The VCCIO pad of each FPGA die is used for receiving IO voltage from the same or substantially the same power source for providing voltage consistency across FPGA dies in package 302. It should be noted that the underlying concept of the exemplary embodiment(s) of the present invention would not change if one or more blocks (circuit or elements) were added to or removed from diagram 300.

In one example, the inter-die connections between dies within a package or module such as package 302 can be achieved with general purpose IOs ("GPIOs"). The GPIOs of each FPGA die are bidirectional and can be used for inter-die links and/or connections. The logic elements of FPGA dies, in one embodiment, can be partitioned and/or combined across multiple FPGA dies to perform certain complex logic operations. In one example, the GPIOs of combined FPGA dies can used to provide inter-die communications.

A global clock, not shown in FIG. 3, is used to provide global, device, and/or system clock signals from an external oscillator or clock module. Alternatively, the global clock which can be an oscillator or clock module can also be situated within package 302. The GCLK pad of each FPGA die is used to receive global clock signals from the same or substantially the same clock source for providing clock synchronization as illustrated by numeral 316.

For example, to minimize data skew or clock skew, the FPGA dies such as FPGA dies 308-310 include global clock pads or GCLK pads used to receive the same or similar global clock signals from the similar clock sources as indicated by numeral 316. In one embodiment, the GCLK pads within FPGA dies are connected together to receive global clock signals for clock synchronization. The global clock can be situated within package 302 or outside of package 302. Depending on the applications, global clock signals transmitted to die #1 and die #2 on the same IO pads should simplify the partition operation over multiple dies. If, however, regular IO pads are used for receiving clock signals, the partition software can compensate potential clock skew by performing clock routings to various IO pads based on desired clock direction and skew tolerance.

Package 302, in one embodiment, employs IO voltage rails for interconnecting VCCIO pads of FPGA dies via package pins such as VCCIO pin 306 for providing voltage consistency. For example, using VCCIO pin 306 to supplying power to FPGA dies should provide similar IO voltage between the dies as indicated by numeral 312.

In one embodiment, package 302 which is an IC module able to be selectively programmed to perform user defined logic functions contains a substrate 320, FPGA dies 308-310, and a global clock distribution 316. Substrate 320 is used to house multiple FPGA dies 308-310 stacked vertically for facilitating transmission of signals between the dies as well as any external communications to and from package 302. It should be noted that substrate 320 can be a type of base board used to house or receive IC chips or dies for couplings. For example, FPGA dies 308-310 are stacked vertically on substrate 320 functioning as a single FPGA device. Global clock distribution 316 is coupled to at least a portion of global clock pads of FPGA dies for providing synchronized clock signals. IO voltage rail 312 is coupled to at least a portion of power IO pins of FPGA dies for providing the same or substantially the same power to FPGA dies.

Figure 4A:
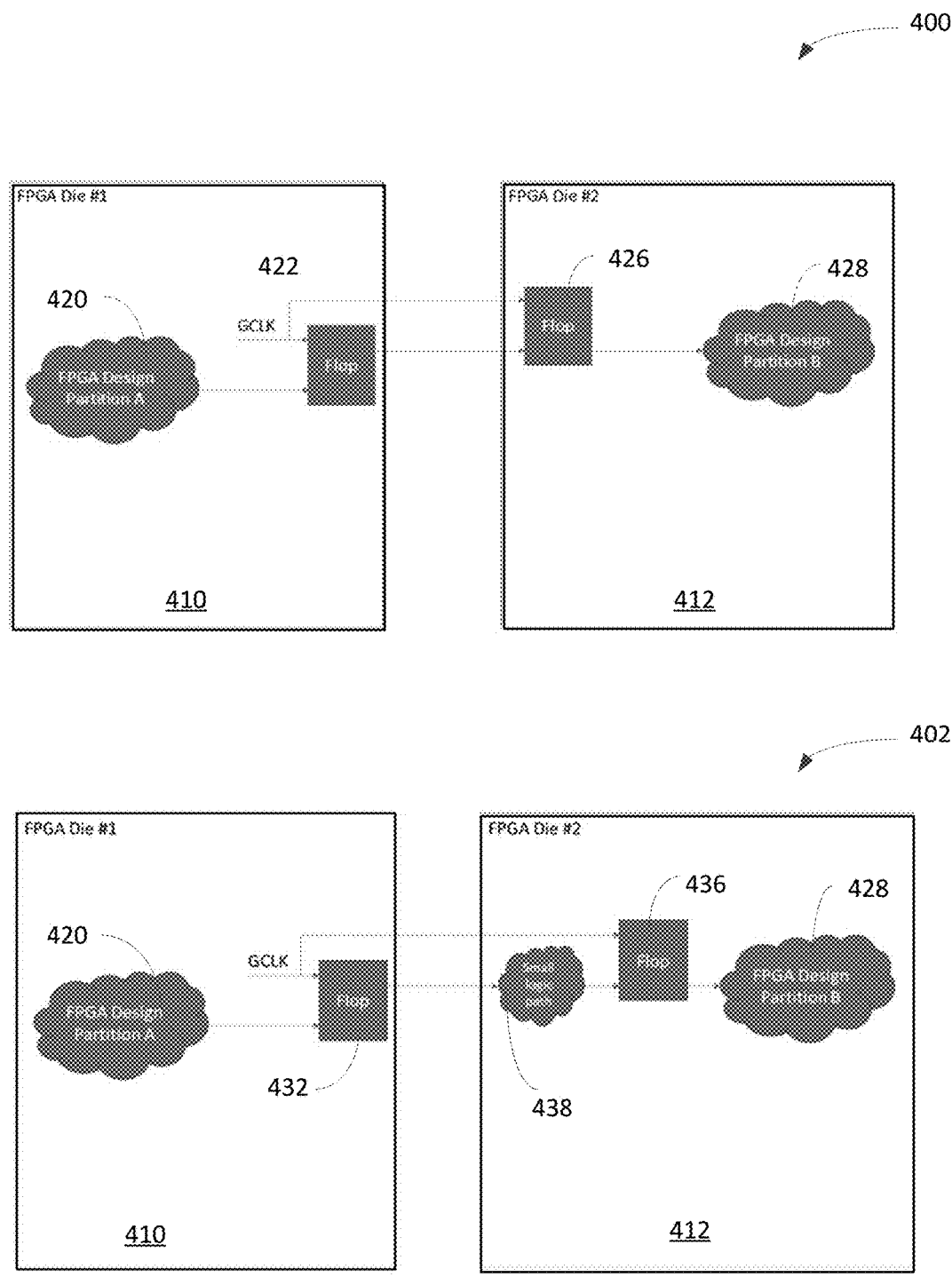
FIGS. 4A-4B are block diagrams illustrating a mechanism of inter-die partitioning or combining across multiple FPGA dies in an FPGA IC package in accordance with one embodiment of the present invention.

FIG. 4A are block diagrams 400-402 illustrating a mechanism of inter-die partitioning and/or combining across multiple FPGA dies in an FPGA IC package in accordance with one embodiment of the present invention. Diagram 400 includes first FPGA die 410 and second FPGA die 412. First FPGA die 410 includes a partition A 420 representing at least a portion of an FPGA design and a latch 422 which is used between clock cycle boundaries. Second FPGA die 412 includes a partition B 428 representing another portion of the FPGA design and a latch 426 which is used between clock cycle boundaries. In one aspect, the FPGA design is to be performed and completed by partition A 420 and partition B 428. It should be noted that the underlying concept of the exemplary embodiment(s) of the present invention would not change if one or more blocks (circuit or elements) were added to or removed from diagram 400.

It should be noted that the FPGA device includes logic elements and flip flops/latches. The logic elements of the FPGA device are used to perform arithmetic calculations based on user defined logic functions while the flip flops or latches are used to align timing constrains relating to data paths or routing paths. For example, data needs to be saved or latched before moving into the next clock cycle. Partitioning of an FPGA design over multiple dies can be optimized by allocating partitioned logic elements between the latches or flip flops. As illustrated in diagram 400, partition A and partition B are separated by two latches 422-426 with no additional logic elements in-between for optimal performance.

Diagram 402 includes first FPGA die 410 and second FPGA die 412. First FPGA die 410 includes a partition A 420 representing an FPGA design and a latch 432. Second FPGA die 412 includes a partition B 428 representing the FPGA design and a latch 436. Diagram 402 is similar to diagram 400 except that diagram 402 includes a logic path 438 in second FPGA die 412. It should be noted that because of logic path 438, the performance of partition A 420 and partition B 428 using latches 432-436 through logic path 438 may be negatively affected due to additional logics in-between. To enhance performance, partitioning through logic area such as logic path 438 should be avoided for any timing critical logics and/or feedback loops.

An advantage of combining or partitioning multiple FPGA dies is that the partitioned FPGA dies can perform more sophisticated logic operations.

Figure 4B:
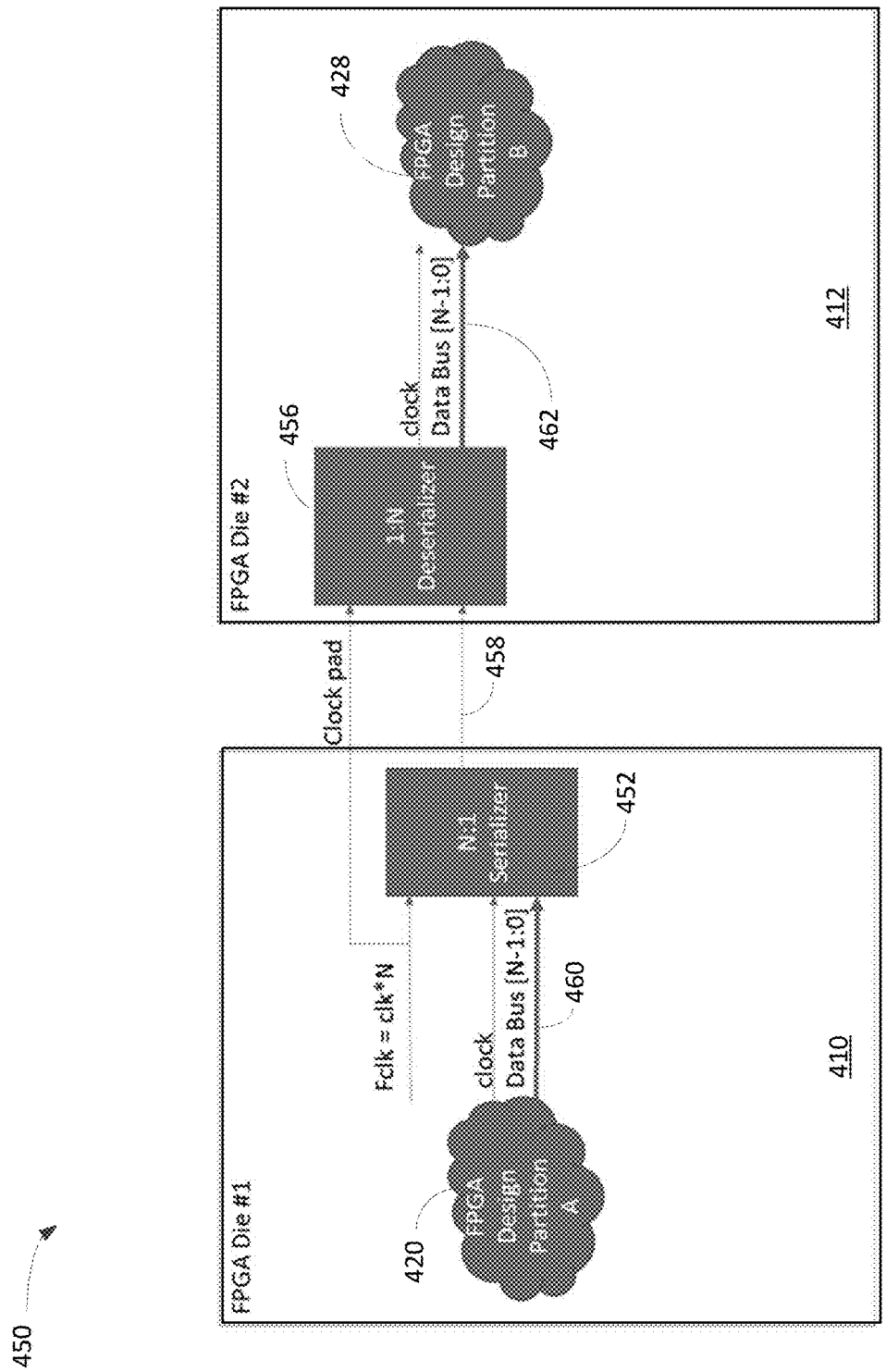

FIG. 4B is a block diagram 450 illustrating a mechanism of inter-die communication between FPGA dies in an FPGA IC package in accordance with one embodiment of the present invention. Diagram 450 includes first FPGA die 410 and second FPGA die 412. First FPGA die 410 includes a partition A 420 representing at least a portion of an FPGA design and second FPGA die 412 includes a partition B 428 representing a portion of the FPGA design. It should be noted that the underlying concept of the exemplary embodiment(s) of the present invention would not change if one or more blocks (circuit or elements) were added to or removed from diagram 450.

Diagram 450 illustrates a mechanism of inter-die communication using existing IO functions in which every FPGA die usually possesses. To minimize routing complexity due to large number of IO pins from the FPGA dies, serializer and deserializer ("serdes") transceivers are used to simplify routing tasks between the FPGA dies. It should be noted that each FPGA die within an FPGA IC package includes built-in serdes for its IO operations. For example, an FPGA die can be configured to use its serdes low-voltage differential signaling ("LVDS") transceivers for either communicating with other FPGA dies or with external systems.

LVDS, in one example, uses a differential, serial signaling standard for transporting electrical signals. For example, LVDS usually operates at low power while running at high speeds via twisted-pair copper cables. The serdes transceivers within each FPGA die, for example, employs a CDR circuitry to identify timing for sampling data over a high-speed data transmission. Thus, the high-speed data paths between FPGA dies can be created by using source synchronous and/or CDR based serdes which already exist in the FPGA dies.

In operation, partition A 420 of FPGA die 410, for example, sends eight (8) bits of information to serializer 452 via an 8-bit bus 460. Serializer 452 serializes eight (8) bits information into a sequence of single bit and sends the serialized bits or data over a single or twisted-pair connection 458 to deserializer 456 of FPGA die 412. Upon receipt of the serialized data from serializer 452 via bus 458, deserializer 456 restores eight (8) bits data from the received serialized data. The restored eight (8) bits data is forwarded to partition B 428 via an 8-bit bus 462.

An advantage of using serdes for inter-die communication is that employing source synchronous and/or CDR based serializers/deserializers to pass data between the FPGA dies improves routings (or wirings) of the IC package.

Figure 5A:
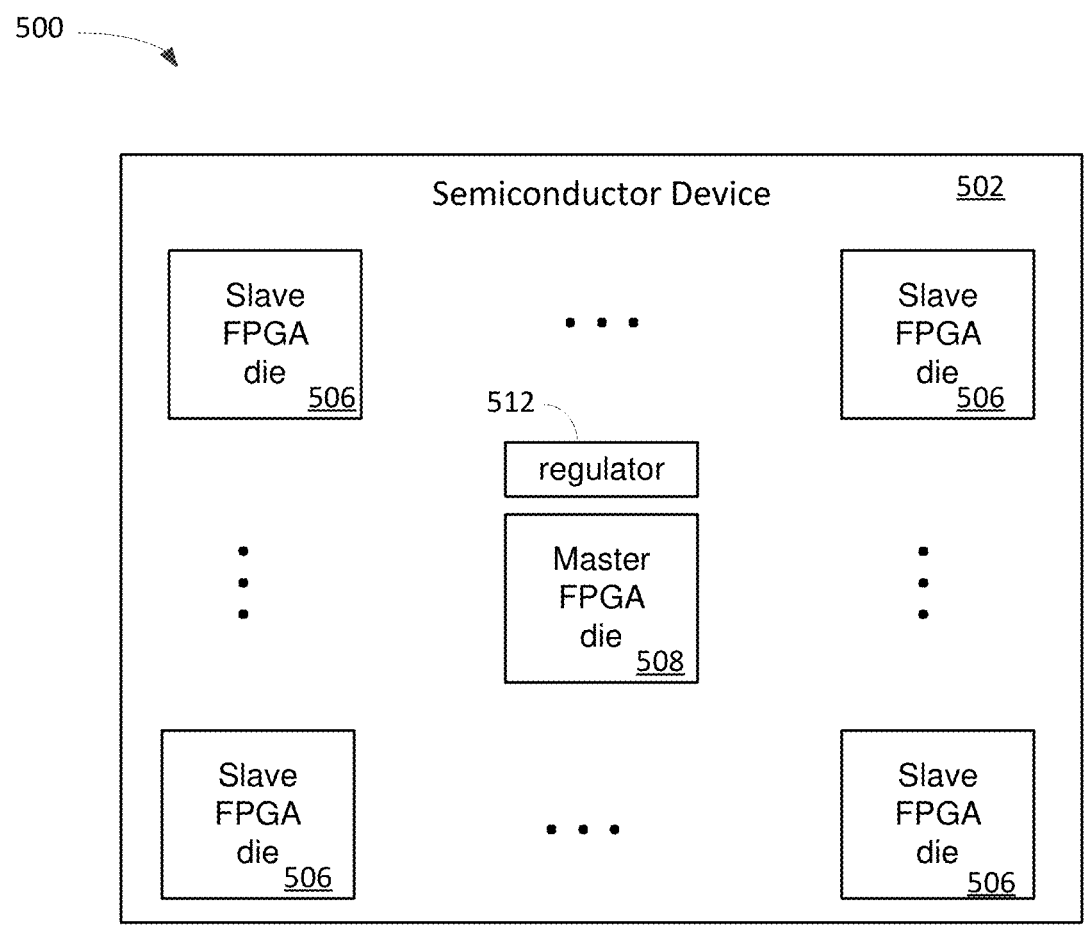
FIGS. 5A-5B are block diagrams illustrating a device containing a regulator for facilitating multiple power domains to an FPGA IC package in accordance with one embodiment of the present invention.

FIG. 5A is a block diagram 500 illustrating a device containing a regulator for facilitating multiple power domains to an FPGA IC package in accordance with one embodiment of the present invention. Diagram 500 illustrates FPGA IC package or semiconductor device 502 wherein semiconductor device 502 includes at least one master FPGA die 508, multiple slave FPGA dies 506, and a configurable power regulator ("CPR") 512. In one example, CPR 512 is a regulator configured to facilitate multiple power domains. In one embodiment, mater FPGA die 508 is configured to control or manage CPR 512 to provide multiple power domains to one or more slave FPGA dies 506. In one aspect, CPR 512 is responsible to handle power supplies to various different FPGA dies requiring different power specifications. It should be noted that the underlying concept of the exemplary embodiment(s) of the present invention would not change if one or more blocks (circuit or elements) were added to or removed from diagram 500.

A semiconductor device 502, in one embodiment, is able to house multiple dies 506-508 wherein at least one die is configurable to perform one or more user defined logic functions. Device 502 includes master FPGA die 508, multiple slave FPGA dies 506, and a selectable power regulator or CPR 512. Master FPGA die, in one aspect, is configured to be programmable to generate enabling signals for managing power distribution in accordance with configuration data. Slave FPGA dies 506 provides logic functions in response to corresponding power domain(s) and/or configuration data. Selectable power regulator or CPR 512 is configured to facilitate providing multiple power domains to slave FPGA dies 506 in accordance with the enabling signals (not shown in FIG. 5A) from master FPGA die 508.

Figure 5B:
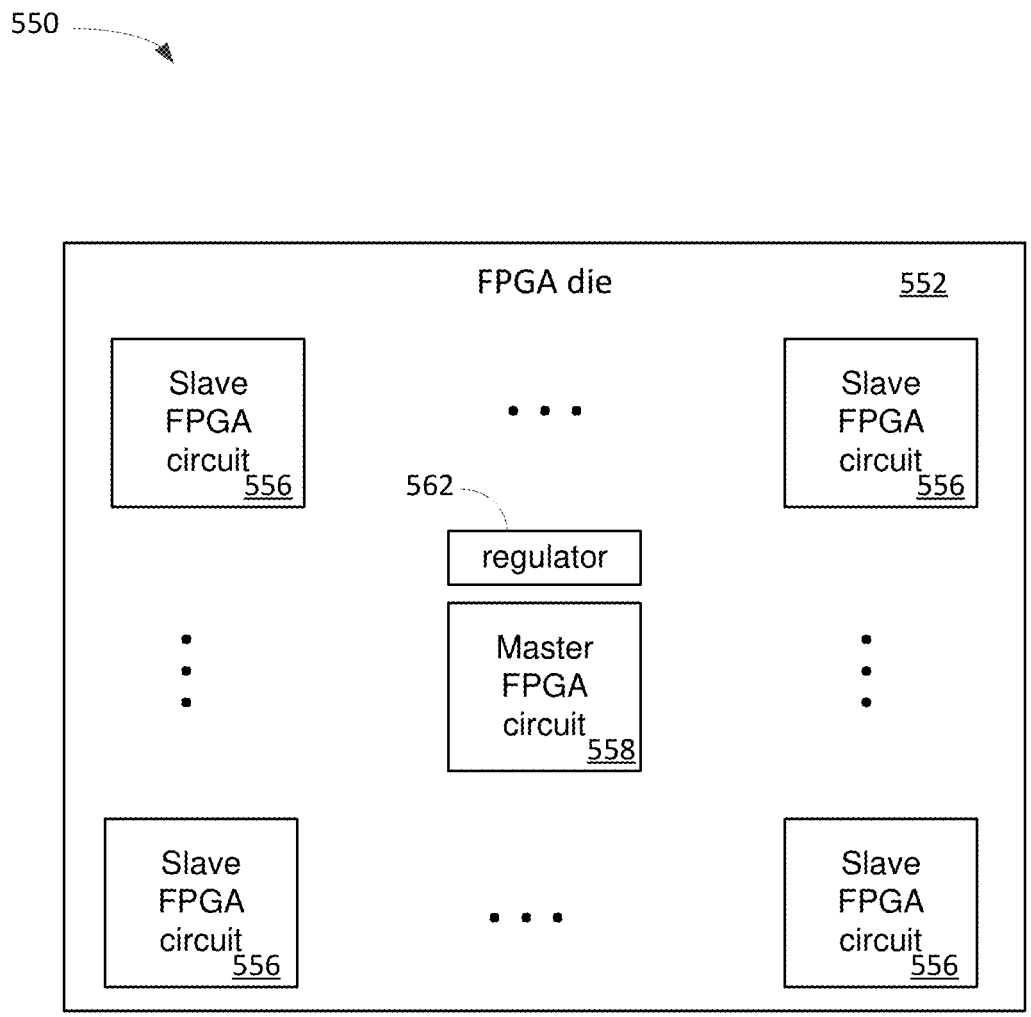

FIG. 5B is a block diagram 550 illustrating a device containing a regulator for facilitating multiple power domains to an FPGA IC package in accordance with one embodiment of the present invention. Diagram 550 which is similar to diagram 500 shown in FIG. 5A except that diagram 550 includes an FPGA die 552 containing at least one master FPGA circuit 558, multiple slave FPGA circuit 566, and CPR circuit 562. In one example, CPR circuit 562, which is similar to CPR 512, performs a function of a regulator for facilitating multiple power domains. In one embodiment, mater FPGA circuit 558 is configured to control or manage CPR circuit 562 to provide multiple power domains to one or more slave FPGA circuits 556. It should be noted that the underlying concept of the exemplary embodiment(s) of the present invention would not change if one or more blocks (circuit or elements) were added to or removed from diagram 550.

Figure 6:
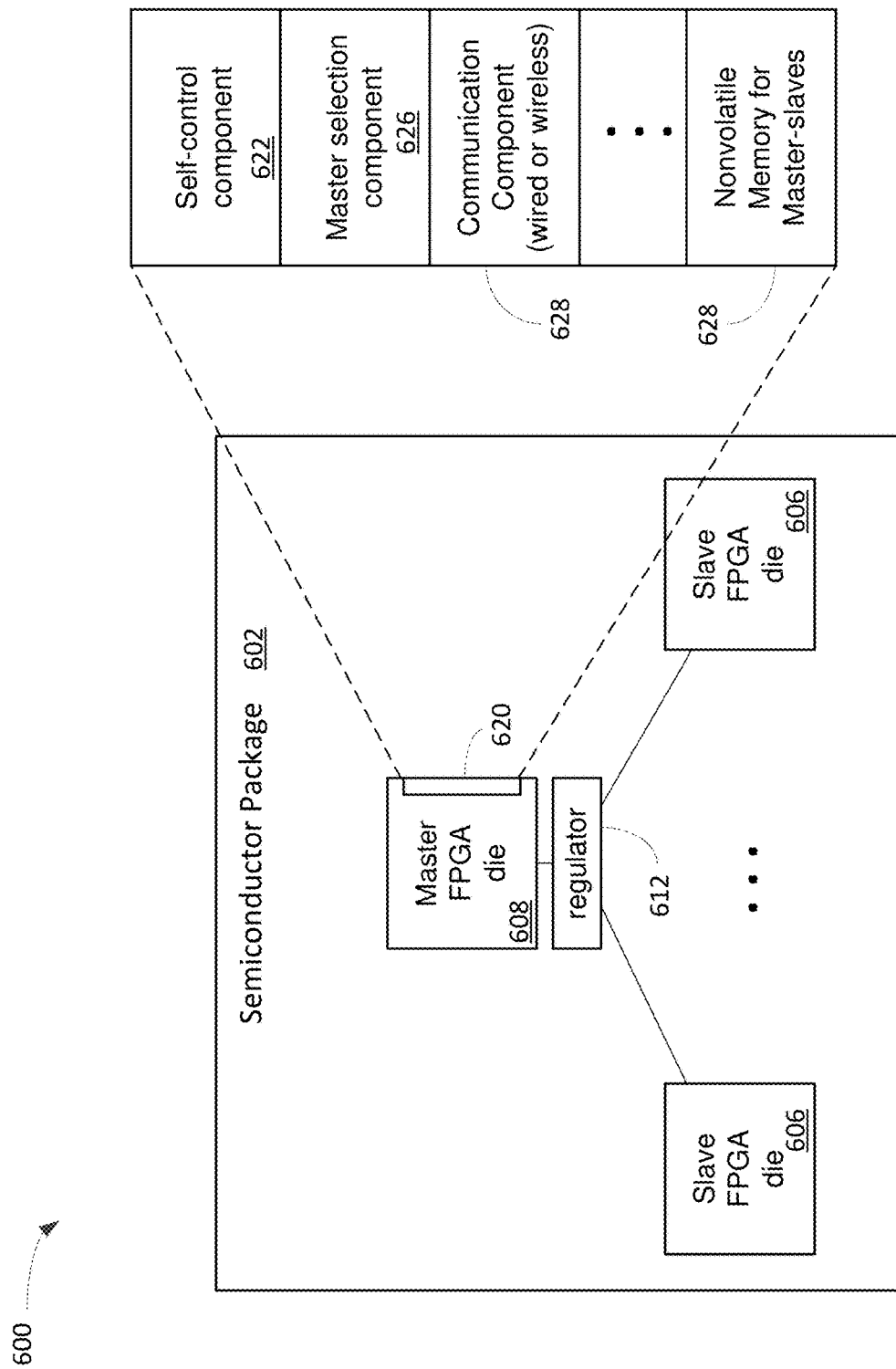
FIG. 6 is a block diagram illustrating a semiconductor package containing master(s) and slave dies operating under multiple power domains in accordance with one embodiment of the present invention.

FIG. 6 is a block diagram 600 illustrating a semiconductor package 602 containing master(s) and slave dies operating under multiple power domains in accordance with one embodiment of the present invention. Package 602 includes a master FPGA die 608, multiple slave FPGA dies 606, and a CPR 612. Master FPGA die 608, in one embodiment, contains a power management 620 for facilitating multiple power domains to slave FPGA dies 606. Power management 620 includes a self-control component 622, master selection component 626, communication component 628, and nonvolatile memory 628. Self-control component, in one aspect, is configured to allow master FPGA die to enter a power saving mode based on the configuration data. Master selection component 626 is configured to elect a new master die from slave FPGA dies 606 based on a set of predefined election process. Communication component 628 provides communication with an external device via a wired or wireless communication network. Nonvolatile memory 628 is configured to selectively grant a request of memory access to one of slave FPGA dies 606.

Programmable Semiconductor Device (PSD)

Figure 7A:
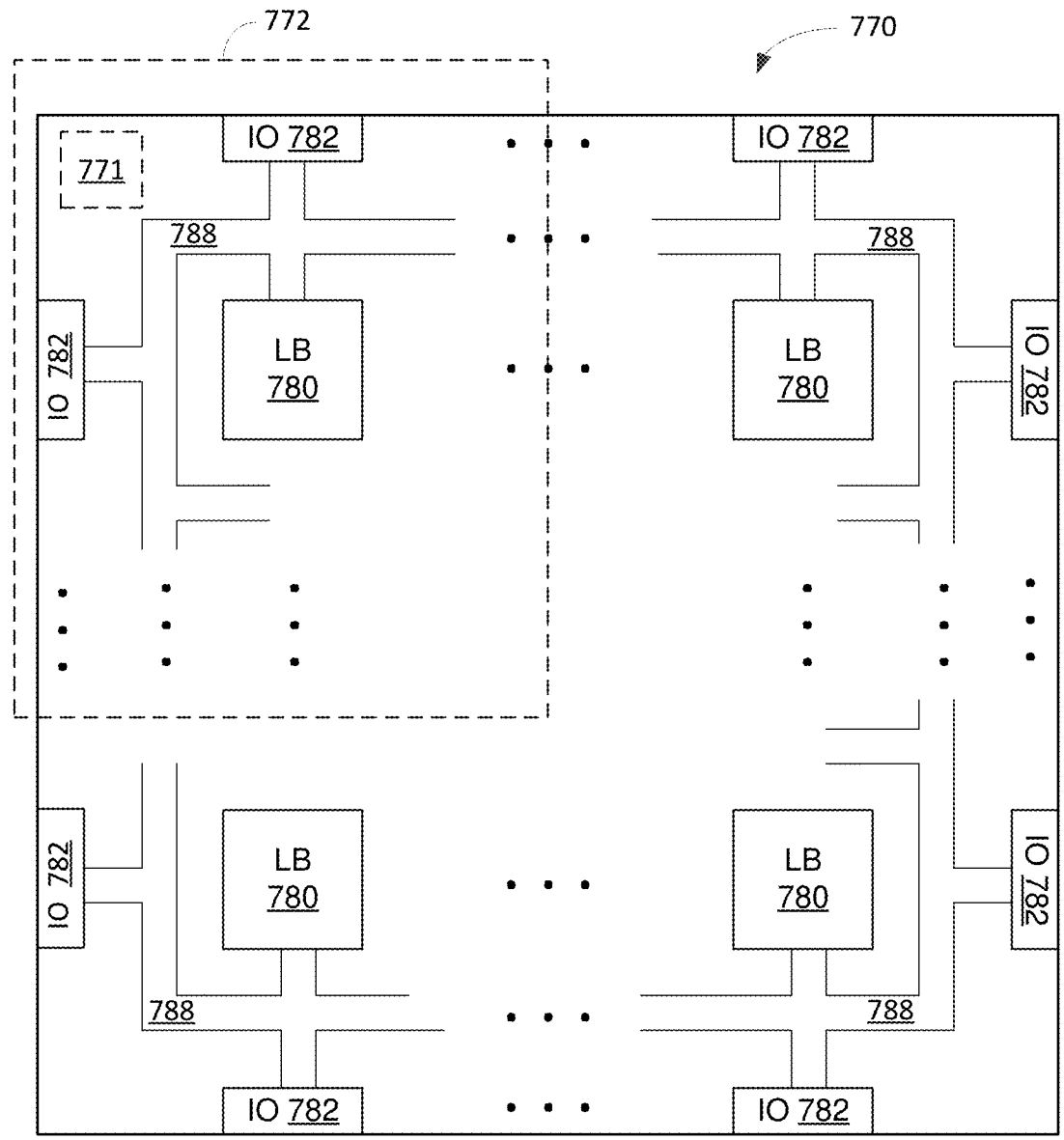
FIGS. 7A-7C are block diagrams illustrating a programmable semiconductor device ("PSD") or FPGA able to be placed in an FPGA IC package in accordance with one embodiment of the present invention.

FIG. 7A is a block diagram 770 illustrating a programmable semiconductor device ("PSD") or FPGA able to be placed in an FPGA IC package in accordance with one embodiment of the present invention. PSD, also known as FPGA, PIC, and/or a type of Programmable Logic Device ("PLD"), includes an UII and/or a SDB capable of facilitating USB 2.0 data transmission. A function of UII and/or SDB is to use a portion of PSD existing logic blocks such as block 720 to facilitate multiple power domains so that it enhances overall versatilities as well as the efficiency of PSD. It should be noted that the underlying concept of the exemplary embodiment(s) of the present invention would not change if one or more blocks (circuit or elements) were added to or removed from diagram 770.

PSD includes an array of configurable LBs 780 surrounded by input/output blocks ("IOs") 782, and programmable interconnect resources 788 ("PIR") that include vertical interconnections and horizontal interconnections extending between the rows and columns of logic block ("LB") 780 and IO 782. PRI 788 may further include interconnecting array decoders ("IAD") or programmable interconnection array ("PIA"). It should be noted that the terms PRI, IAD, and PIA may be used interchangeably hereinafter.

Each LB, in one example, includes programmable combinational circuitry and selectable output registers programmed to implement at least a portion of a user's logic function. The programmable interconnections, connections, or channels of interconnect resources are configured using various switches to generate signal paths between the LBs 780 for performing logic functions. Each IO 782 is programmable to selectively use an IO pin (not shown) of PSD.

PIC, in one embodiment, can be divided into multiple programmable partitioned regions ("PPRs") 772 wherein each PPR 772 includes a portion of LBs 780, some PPRs 788, and IOs 782. A benefit of organizing PIC into multiple PPRs 772 is to optimize management of storage capacity, power supply, and/or network transmission.

Bitstream is a binary sequence (or a file) containing programming information or data for a PIC, FPGA, or PLD. The bitstream is created to reflect the user's logic functions together with certain controlling information. For an FPGA or PLD to function properly, at least a portion of the registers or flipflops in FPGA needs to be programmed or configured before it can function. It should be noted that bitstream is used as input configuration data to FPGA.

Figure 7B:
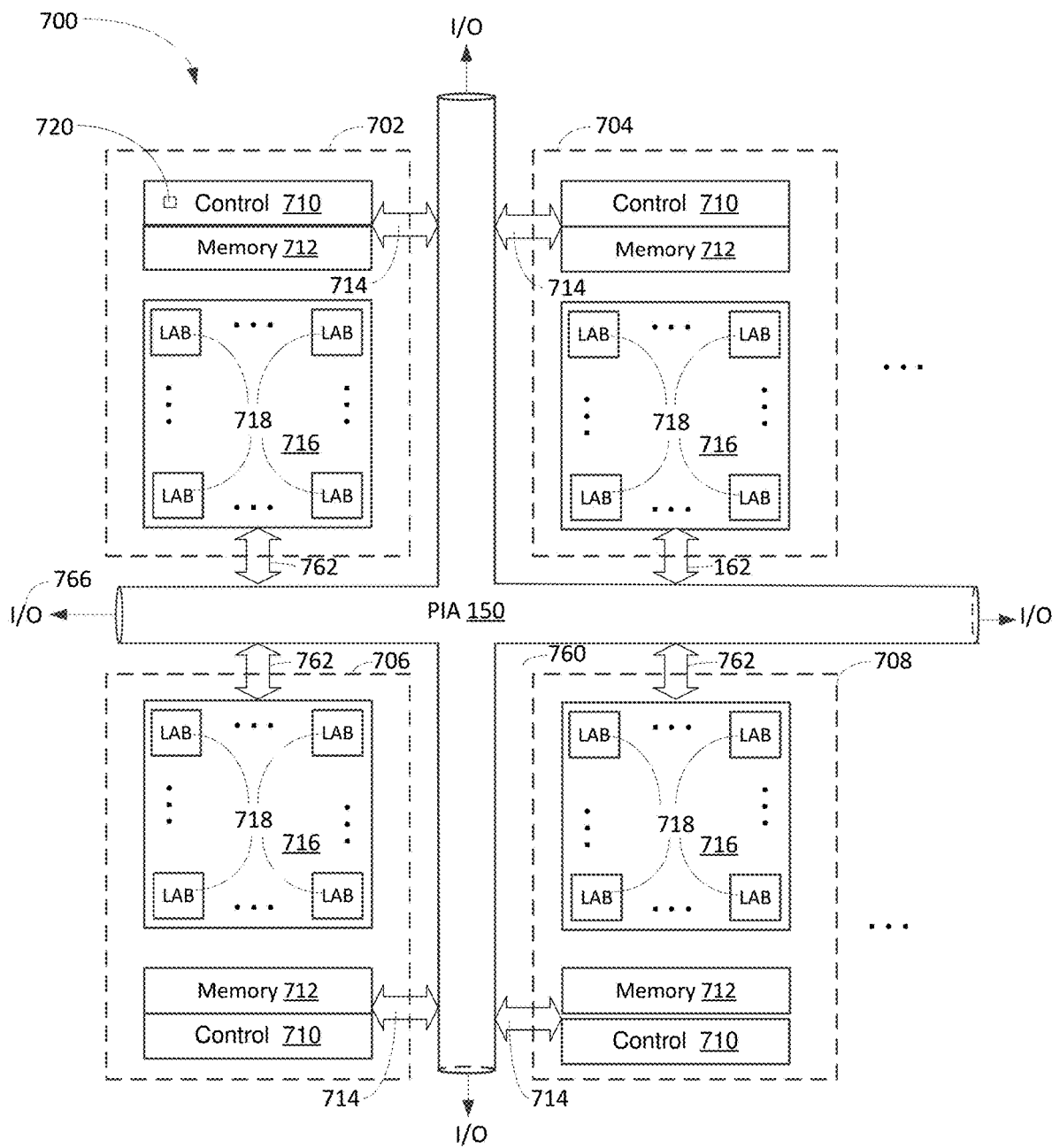

FIG. 7B is block diagrams illustrating a PSD or PSD die operable to carry out various user-defined logic operations that can be placed in a package with multiple PDS die in accordance with one embodiment of the present invention. To simplify the foregoing discussion, the terms "PSD", "PIC", FPGA, and PLD are referring the same or similar devices and they can be used interchangeably hereinafter. Diagram 700 includes multiple PPRs 702-708, PIA 750, and regional IO ports 766. PPRs 702-708 further includes control units 710, memory 712, and LBs 716. Note that control units 710 can be configured into one single control unit, and similarly, memory 712 can also be configured into one single memory for storing configurations. It should be noted that the underlying concept of the exemplary embodiment(s) of the present invention would not change if one or more blocks (circuit or elements) were added to or removed from diagram 700.

LBs 716, also known as configurable function unit ("CFU") include multiple logic array blocks ("LABs") 718 which is also known as a configurable logic unit ("CLU"). Each LAB 716, for example, can be further organized to include, among other circuits, a set of programmable logical elements ("LEs"), configurable logic slices ("CLS"), or macrocells, not shown in FIG. 7B. Each LAB, in one example, may include anywhere from 32 to 512 programmable LEs. IO pins (not shown in FIG. 7B), LABs, and LEs are linked by PIA 750 and/or other buses, such as buses 762 or 714, for facilitating communication between PIA 750 and PPRs 702-708.

Each LE includes programmable circuits such as the product-term matrix, lookup tables, and/or registers. LE is also known as a cell, configurable logic block ("CLB"), slice, CFU, macrocell, and the like. Each LE can be independently configured to perform sequential and/or combinatorial logic operation(s). It should be noted that the underlying concept of PSD would not change if one or more blocks and/or circuits were added or removed from PSD.

Control units 710, also known as configuration logics, can be a single control unit. Control unit 710, for instance, manages and/or configures individual LE in LAB 718 based on the configuring information stored in memory 712. It should be noted that some IO ports or IO pins are configurable so that they can be configured as input pins and/or output pins. Some IO pins are programmed as bi-directional IO pins while other IO pins are programmed as unidirectional IO pins. The control units such as unit 710 are used to handle and/or manage PSD operations in accordance with system clock signals.

LBs 716 include multiple LABs that can be programmed by the end-user(s). Each LAB contains multiple LEs wherein each LE further includes one or more lookup tables ("LUTs") as well as one or more registers (or D flip-flops or latches). Depending on the applications, LEs can be configured to perform user-specific functions based on a predefined functional library facilitated by the configuration software. PSD, in some applications, also includes a set fixed circuit for performing specific functions. For example, the fixed circuits include, but not limited to, a processor(s), a DSP (digital signal processing) unit(s), a wireless transceiver(s), and so forth.

PIA 750 is coupled to LBs 716 via various internal buses such as buses 714 or 762. In some embodiments, buses 714 or 762 are part of PIA 750. Each bus includes channels or wires for transmitting signals. It should be noted that the terms channel, routing channel, wire, bus, connection, and interconnection are referred to as the same or similar connections and will be used interchangeably herein. PIA 750 can also be used to receive and/or transmits data directly or indirectly from/to other devices via IO pins and LABs.

Memory 712 may include multiple storage units situated across a PPR. Alternatively, memories 712 can be combined into one single memory unit in PSD. In one embodiment, memory 712 is an NVM storage unit used for both configuration and user memory. The NVM storage unit can be, but not limited to, MRAM, flash, Ferroelectric RAM, and/or phase changing memory (or chalcogenide RAM). Depending on the applications, a portion of the memory 712 can be designated, allocated, or configured to be a block RAM ("BRAM") used for storing large amounts of data in PSD.

A PSD includes many programmable or configurable LBs 716 that are interconnected by PIA 750, wherein each programmable LB is further divided into multiple LABs 718. Each LAB 718 further includes many LUTs, multiplexers and/or registers. During configuration, a user programs a truth table for each LUT to implement a desired logical function. It should be noted that each LAB, which can be further organized to include multiple logic elements ("LEs"), can be considered as a configurable logic cell ("CLC") or slice. For example, a four-input (16 bit) LUT receives LUT inputs from a routing structure (not shown in FIG. 7B). Based upon the truth table programmed into LUT during configuration of PSD, a combinatorial output is generated via a programmed truth table of LUT in accordance with the logic values of LUT inputs. The combinatorial output is subsequently latched or buffered in a register or flip-flop before the clock cycle ends.

Figure 7C:
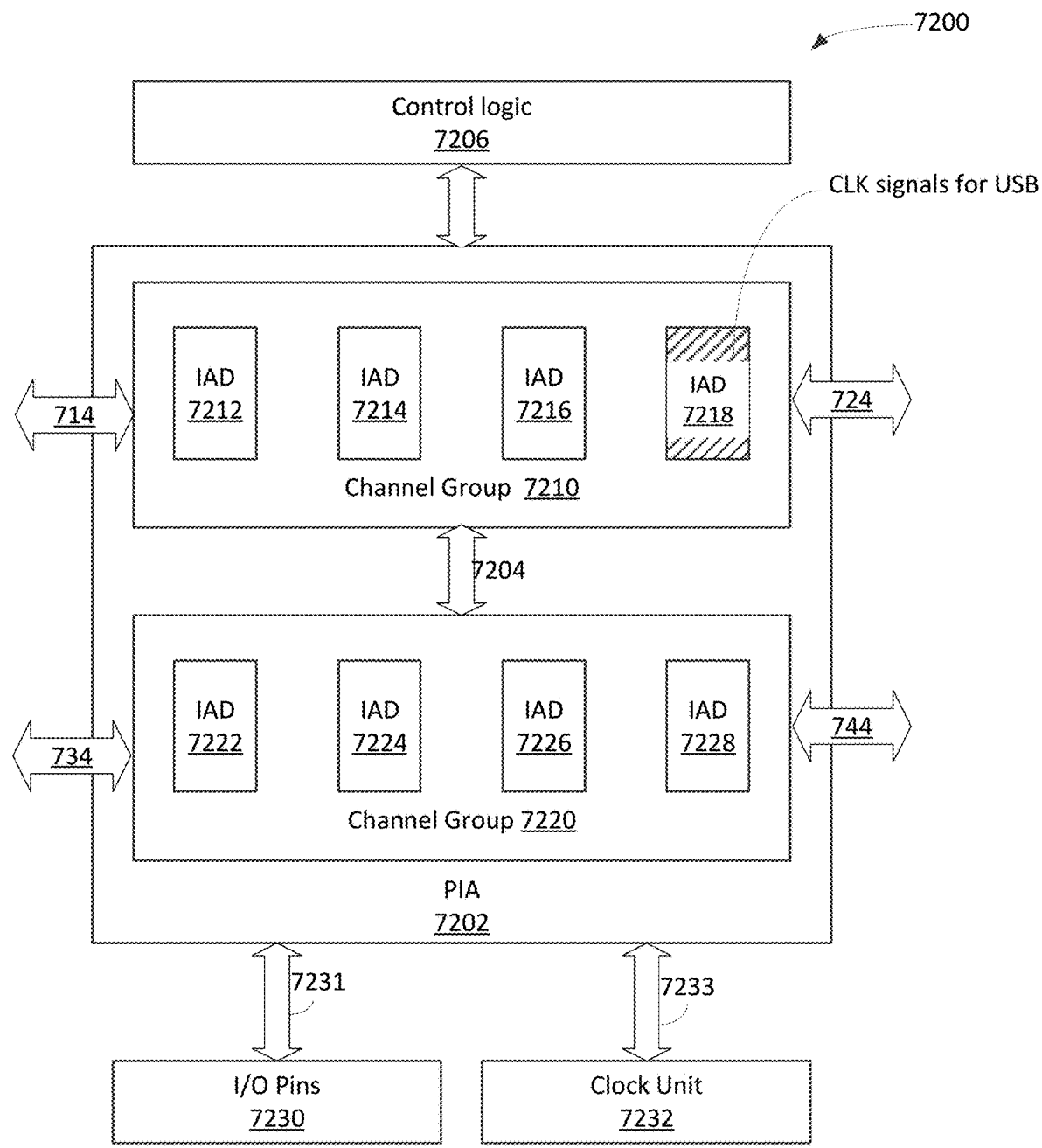

FIG. 7C is a block diagram 7200 illustrating a routing logic or routing fabric containing programmable interconnection arrays capable of routing inter-die communications in accordance with one embodiment of the present invention. Diagram 7200 includes control logic 7206, PIA 7202, IO pins 7230, and clock unit 7232. Control logic 7206, which may be similar to control units shown in FIG. 7C, provides various control functions including channel assignment, differential IO standards, and clock management. Control logic 7206 may contain volatile memory, nonvolatile memory, and/or a combination of the volatile and nonvolatile memory device for storing information such as configuration data. In one embodiment, control logic 7206 is incorporated into PIA 7202. It should be noted that the underlying concept of the exemplary embodiment(s) of the present invention would not change if one or more blocks (circuit or elements) were added to or removed from diagram 7200.

IO pins 7230, connected to PIA 7202 via a bus 7231, contain many programmable IO pins configured to receive and/or transmit signals to external devices. Each programmable IO pin, for instance, can be configured to input, output, and/or bi-directional pin. Depending on the applications, IO pins 7230 may be incorporated into control logic 7206.

Clock unit 7232, in one example, connected to PIA 7202 via a bus 7233, receives various clock signals from other components, such as a clock tree circuit or a global clock oscillator. Clock unit 7232, in one instance, generates clock signals in response to system clocks as well as reference clocks for implementing IO communications. Depending on the applications, clock unit 7232, for example, provides clock signals to PIA 7202 including reference clock(s).

PIA 7202, in one aspect, is organized into an array scheme including channel groups 7210 and 7220, bus 7204, and IO buses 714, 724, 734, 744. Channel groups 7210, 7220 are used to facilitate routing information between LBs based on PIA configurations. Channel groups can also communicate with each other via internal buses or connections such as bus 7204. Channel group 7210 further includes interconnecting array decoders ("IADs") 7212-7218. Channel group 7220 includes four IADs 7222-7228. A function of IAD is to provide configurable routing resources for data transmission.

IAD such as IAD 7212 includes routing multiplexers or selectors for routing signals between IO pins, feedback outputs, and/or LAB inputs to reach their destinations. For example, an IAD can include up to 36 multiplexers which can be laid out in four banks wherein each bank contains nine rows of multiplexers. It should be noted that the number of IADs within each channel group is a function of the number of LEs within the LAB.

PIA 7202, in one embodiment, designates a special IAD such as IAD 7218 for facilitating multiple power domains. For example, IAD 7218 handles or distributes connections and/or routings multiple power domains.

Systems and Network Systems

Figure 8:
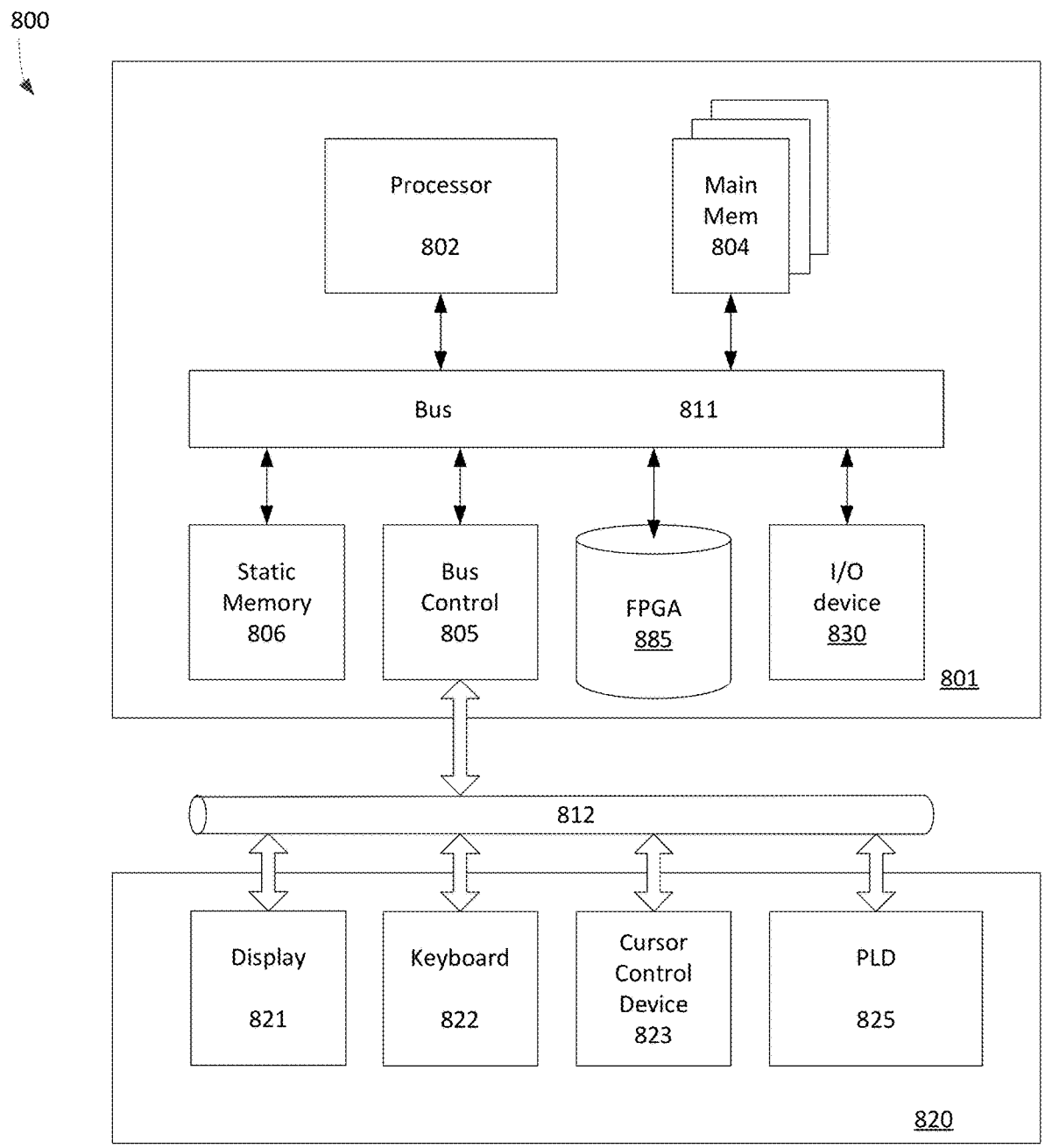
FIG. 8 is a diagram illustrating a system or computer using an FPGA IC package as a single PLD or PSD in accordance with one embodiment of the present invention.

FIG. 8 is a diagram illustrating a system or computer using one or more FPGA IC packages as a single PSD or FPGA device in accordance with one embodiment of the present invention. Computer system 800 includes a processing unit 801, an interface bus 812, and an input/output ("IO") unit 820. Processing unit 801 includes a processor 802, main memory 804, system bus 811, static memory device 806, bus control unit 805, IO element 830, and FPGA 885. It should be noted that the underlying concept of the exemplary embodiment(s) of the present invention would not change if one or more blocks (circuit or elements) were added to or removed from FIG. 8.

Bus 811 is used to transmit information between various components and processor 802 for data processing. Processor 802 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 804, which may include multiple levels of cache memories, stores frequently used data and instructions. Main memory 804 may be RAM (random access memory), MRAM (magnetic RAM), or flash memory. Static memory 806 may be a ROM (read-only memory), which is coupled to bus 811, for storing static information and/or instructions. Bus control unit 805 is coupled to buses 811-812 and controls which component, such as main memory 804 or processor 802, can use the bus. Bus control unit 805 manages the communications between bus 811 and bus 812. Mass storage memory or SSD which may be a magnetic disk, an optical disk, hard disk drive, floppy disk, CD-ROM, and/or flash memories are used for storing large amounts of data.

IO unit 820, in one embodiment, includes a display 821, keyboard 822, cursor control device 823, and low-power PLD 825. Display device 821 may be a liquid crystal device, cathode ray tube ("CRT"), touch-screen display, or other suitable display devices. Display 821 projects or displays images of a graphical planning board. Keyboard 822 may be a conventional alphanumeric input device for communicating information between computer system 800 and computer operator(s). Another type of user input device is cursor control device 823, such as a conventional mouse, touch mouse, trackball, or other types of the cursor for communicating information between system 800 and user(s).

PLD 825 is coupled to bus 812 for providing configurable logic functions to local as well as remote computers or servers through a wide-area network. PLD 825 and/or FPGA 885 are configured to facilitate the operation of UTI and/or SDB to improve overall efficiency of FPGA and/or PLD. In one example, PLD 825 may be used in a modem or a network interface device for facilitating communication between computer 800 and the network. Computer system 800 may be coupled to servers via a network infrastructure as illustrated in the following discussion.

Figure 9:
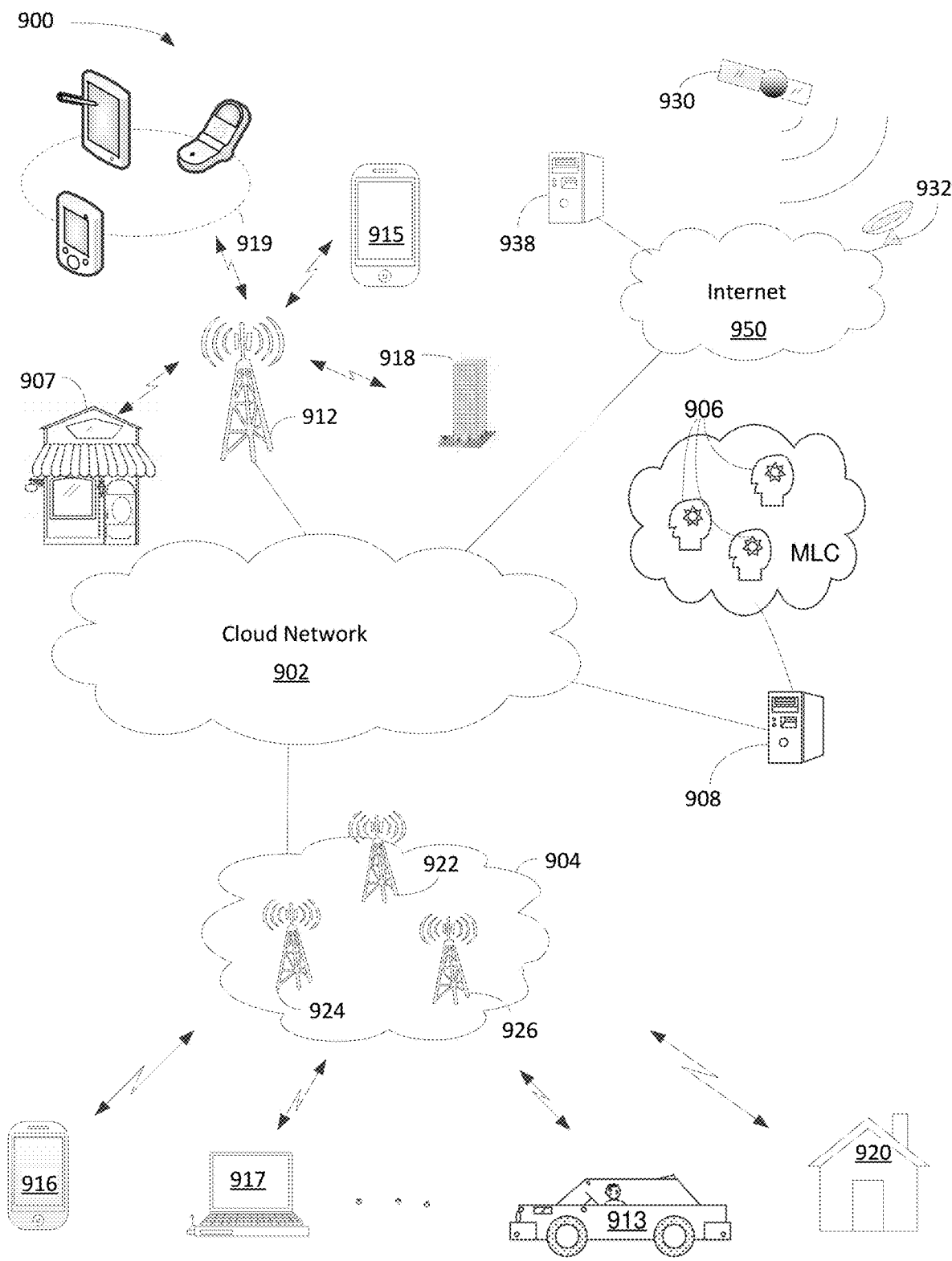
FIG. 9 is a block diagram illustrating various applications of an FPGA IC package containing multiple PSDs (e.g., FPGAs, PLDs, etc.) in accordance with one embodiment of the present invention.

FIG. 9 is a block diagram illustrating various applications of an FPGA IC package containing multiple PSDs (e.g., FPGAs, PLDs, etc.) in accordance with one embodiment of the present invention in accordance with one embodiment of the present invention. Diagram 900 illustrates AI server 908, communication network 902, switching network 904, Internet 950, and portable electric devices 913-919. In one aspect, PSD capable of facilitating multiple power domains is used in an AI server, portable electric devices, and/or switching network. Network or cloud network 902 can be a wide area network, metropolitan area network ("MAN"), local area network ("LAN"), satellite/terrestrial network, or a combination of a wide-area network, MAN, and LAN. It should be noted that the underlying concept of the exemplary embodiment(s) of the present invention would not change if one or more blocks (or networks) were added to or removed from diagram 900.

Network 902 includes multiple network nodes, not shown in FIG. 9, wherein each node may include mobility management entity ("MME"), radio network controller ("RNC"), serving gateway ("S-GW"), packet data network gateway ("P-GW"), or Home Agent to provide various network functions. Network 902 is coupled to Internet 950, AI server 908, base station 912, and switching network 904. Server 908, in one embodiment, includes machine learning computers ("MLC") 906.

Switching network 904, which can be referred to as packet core network, includes cell sites 922-926 capable of providing radio access communication, such as 3G ($3^{rd}$ generation), 4G, or 5G cellular networks. Switching network 904, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 904 is logically coupling multiple users and/or mobiles 916-920 across a geographic area via cellular and/or wireless networks. It should be noted that the geographic area may refer to campus, city, metropolitan area, country, continent, or the like.

Base station 912, also known as cell-site, node B, or eNodeB, includes a radio tower capable of coupling to various user equipments ("UEs") and/or electrical user equipments ("EUEs"). The term UEs and EUEs are referring to similar portable devices and they can be used interchangeably. For example, UEs or PEDs can be cellular phone 915, laptop computer 917, iPhone® 916, tablets, and/or iPad® 919 via wireless communications. A handheld device can also be a smartphone, such as iPhone®, BlackBerry®, Android®, and so on. Base station 912, in one example, facilitates network communication between mobile devices such as portable handheld device 913-919 via wired and wireless communications networks. It should be noted that base station 912 may include additional radio towers as well as other land switching circuitry.

Internet 950 is a computing network using Transmission Control Protocol/Internet Protocol ("TCP/IP") to provide linkage between geographically separated devices for communication. Internet 950, in one example, couples to supplier server 938 and satellite network 930 via satellite receiver 932. Satellite network 930, in one example, can provide many functions as wireless communication as well as a global positioning system ("GPS"). It should be noted that the UII and/or SDB operation enhancing efficiency of FPGA can benefit many applications, such as but not limited to, smartphones 913-919, satellite network 930, automobiles 913, AI servers 908, business 907, and homes 920.

The exemplary embodiment of the present invention includes various processing steps, which will be described below. The steps of the embodiment may be embodied in machine or computer-executable instructions. The instructions can be used to cause a general-purpose or special-purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 10:
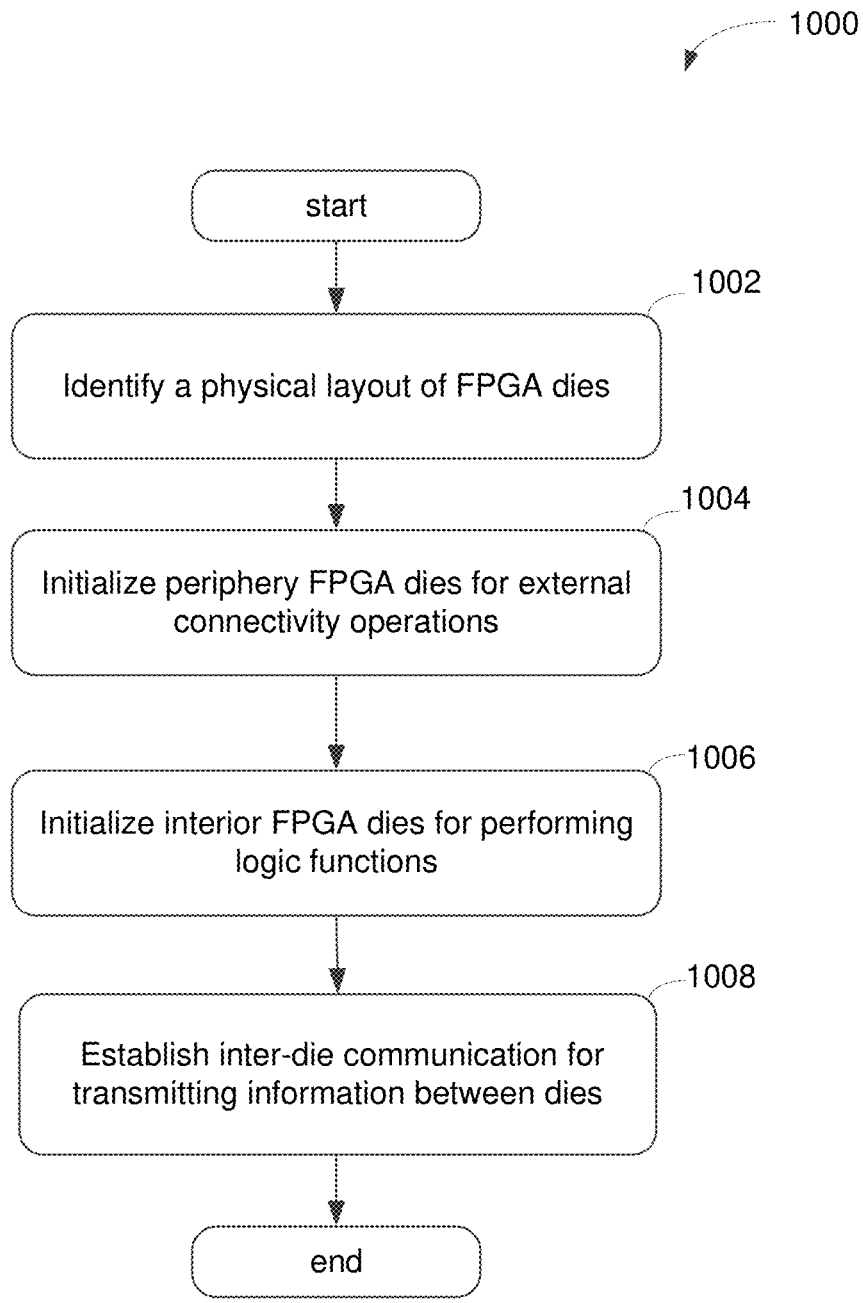
FIG. 10 is a flowchart illustrating a process of configuring an FPGA IC package or module containing multiple FPGA dies in accordance with one embodiment of the present invention.

FIG. 10 is a flowchart 1000 illustrating a process of configuring an FPGA IC package or module containing multiple FPGA dies in accordance with one embodiment of the present invention. At block 1002, a process capable of managing a group of FPGA dies in a package is able to identify a physical layout of FPGA dies within a package or module for performing a set of user defined logical functions in accordance with a bitstream of configuration data.

At block 1004, a first portion of the FPGA dies situated at periphery of the package is initialized for the external connectivity operations. For example, the periphery FPGA dies can be used to communicate with a remote host, server, and/or computer via a communication network. In one aspect, the communication network can be wired, wireless, and/or a combination of wired and wireless network.

At block 1006, the process initializes a second portion of the FPGA dies situated interior of the package for performing logic functions requiring inter-die partitioning in response to the bitstream of configuration data. For example, certain larger or complex logic operations/calculations require a large FPGA device to carry out. With the FPGA IC package, the FPGA dies can be bundled together to perform a sophisticated logic operation. As such, the application of FPGA IC package enhances overall application of FPGA devices.

At block 1008, the inter-die communication channels need to be established between the FPGA dies for transmitting information between the FPGA dies based on the bitstream of configuration data. For example, the portions of serializer and deserializer input output ("IO") functions or transceivers are designated or programmed for facilitating inter-die communications. In one embodiment, the portions of CDR functions are designated or configured for facilitating inter-die communications. It should be noted that during wiring, logic elements with latches of timing boundary(s) across multiple FPGA dies are identified for inter-die partitioning. Alternatively, a set of pads are used to directly couple multiple FPGA dies with reduced capacitance. In one embodiment, the VCC input output ("IO") pin(s) is used to couple to FPGA dies for synchronizing voltage output levels. A global clock is used to provide clock signals to FPGA dies for clock synchronization of the package.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. An integrated circuit ("IC") module able to be selectively configured to perform one or more user defined logic functions, the module comprising:
   a substrate able to house multiple IC chips side-by-side for facilitating transmission of signals between the IC chips;
   a plurality of field-programmable gate array ("FPGA") dies placed on the substrate functioning as a single FPGA entity, wherein periphery dies of the plurality of FPGA dies are configured for external connectivity and interior dies of the plurality of FPGA dies are configured to be interconnected to perform user defined logic functions; and
   a plurality of pads coupled to the FPGA dies and configured to provide connection between at least some of the plurality of FPGA dies.

2. The module of claim 1, further comprising a global clock coupled to at least a portion of global clock pads associated to the plurality of FPGA dies for providing synchronized clock signals.

3. The module of claim 1, further comprising an input output ("IO") voltage rail coupled to at least a portion of power IO pins of the plurality of FPGA dies for providing substantially same voltage power to at least a portion of the PFGA dies.

4. The module of claim 1, wherein a first pad of the plurality of pads coupled to a first die of the plurality of FPGA dies is connected to a second pad of the plurality of pads coupled to a second die of the plurality of FPGA dies via a first bonding wire.

5. The module of claim 1, wherein a first FPGA die of the plurality of FPGA dies is configured to receive data from a second FPGA die of the plurality of FPGA dies via a clock and data recovery ("CDR") based serializers and deserializers ("serdes") component.

6. The module of claim 1, wherein a serializer of a first FPGA die of the plurality of FPGA dies is coupled to a deserializer of a second FPGA die of the plurality of FPGA dies for facilitating communication between the first FPGA die and the second FPGA die.

7. The module of claim 1, wherein the module is an integrated circuit ("IC") for a system on a chip ("SOC").

8. The module of claim 1, wherein the module is a system in package ("SIP") containing multiple dies for data processing.

9. A digital processing system capable of processing data comprising the IC module of claim 1.

10. A method of managing a plurality of field-programmable gate array ("FPGA") dies in a package, comprising:
    identifying a physical layout of FPGA dies for performing a set of user defined logical functions in accordance with a bitstream of configuration data;
    initializing a first portion of the FPGA dies situated at periphery of the package for external connectivity operations and a second portion of the FPGA dies situated interior of the package for performing logic functions via inter-die partitioning in response to the bitstream of configuration data; and
    establishing inter-die communication between the FPGA dies for transmitting information between the FPGA dies based on the bitstream of configuration data.

11. The method of claim 10, wherein establishing inter-die communication further includes designating portions of serializer and deserializer input output ("IO") functions for facilitating die-to-die communications.

12. The method of claim 10, wherein establishing inter-die communication further includes designating portions of clock and data recovery ("CDR") functions for facilitating inter-die communications.

13. The method of claim 10, wherein establishing inter-die communication further includes providing a plurality of pads for directly coupling between the FPGA dies for facilitating inter-die communications.

14. The method of claim 10, further comprising providing VCC input output ("IO") to at least a portion of the FPGA dies for synchronizing voltage output levels.

15. The method of claim 10, further comprising providing global clock signals to at least a portion of the FPGA dies for synchronizing clock cycles.

16. The method of claim 10, further comprising identifying logic elements with latches situated at timing boundaries across multiple FPGA dies for inter-die partitioning.

17. An integrated circuit ("IC") module able to be selectively configured to perform one or more user defined logic functions, the module comprising:
- a substrate able to house multiple IC chips stacked vertically for facilitating transmission of signals between the IC chips;
- a plurality of field-programmable gate array ("FPGA") dies vertically stacked over the substrate functioning as a single FPGA device, wherein periphery dies of the plurality of FPGA dies are configured for external connectivity and interior dies of the plurality of FPGA dies are configured to be interconnected to perform user defined logic functions; and
- a global clock coupled to at least a portion of global clock pads associated to the plurality of FPGA dies for providing synchronized clock signals.

18. The module of claim 17, further comprising a plurality of pads coupled to the FPGA dies and configured to provide connections between at least some of the plurality of FPGA dies.

19. The module of claim 17, further comprising an input output ("IO") voltage rail coupled to at least a portion of power IO pins of the plurality of FPGA die for providing substantially same voltage power to at least a portion of the PFGA die.

20. The module of claim 17, further comprising a first pad of a plurality of pads coupled to a first die of the plurality of FPGA dies is connected to a second pad of the plurality of pads coupled to a second die of the plurality of FPGA dies via a bonding wire.

\* \* \* \* \*